United States Patent
Ge et al.

(10) Patent No.: US 9,589,489 B2
(45) Date of Patent: Mar. 7, 2017

(54) PROBE FRAME FOR ARRAY SUBSTRATE DETECTING APPARATUS AND DETECTING APPARATUS HAVING THE SAME

(71) Applicants:BOE Technology Group Co., Ltd., Beijing (CN); Beijing BOE Display Technology Co., Ltd., Beijing (CN)

(72) Inventors: Xing Ge, Beijing (CN); Zhen Wei, Beijing (CN); Chengda Zhu, Beijing (CN); Jian Sheng, Beijing (CN); Yuanyi Cai, Beijing (CN); Lixing Zhang, Beijing (CN); Qingsheng Li, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 536 days.

(21) Appl. No.: 14/105,947

(22) Filed: Dec. 13, 2013

(65) Prior Publication Data

US 2014/0167807 A1    Jun. 19, 2014

(30) Foreign Application Priority Data

Dec. 14, 2012 (CN) .......................... 2012 1 0546649

(51) Int. Cl.
    *G01R 31/00* (2006.01)
    *G09G 3/00* (2006.01)
    (Continued)

(52) U.S. Cl.
    CPC ......... *G09G 3/006* (2013.01); *G01R 31/2889* (2013.01); *G09G 3/3611* (2013.01)

(58) Field of Classification Search
    USPC ....................................... 324/756.03, 756.05
    See application file for complete search history.

(56) References Cited

U.S. PATENT DOCUMENTS

| 2004/0232930 | A1* | 11/2004 | Shibuya | G01R 31/2889 324/756.07 |
| 2008/0153316 | A1* | 6/2008 | Rabotti | H01R 12/724 439/34 |
| 2011/0148451 | A1* | 6/2011 | Swart | G01R 31/2844 324/756.05 |

FOREIGN PATENT DOCUMENTS

CN      101021627 A      8/2007

OTHER PUBLICATIONS

Second Chinese Office Action for Chinese Patent Application No. 201210546649.4, dated Apr. 22, 2015, 4 pages.
(Continued)

*Primary Examiner* — Minh Phan
(74) *Attorney, Agent, or Firm* — Westman, Champlin & Koehler, P.A.

(57) ABSTRACT

The present invention discloses a probe frame for an array substrate detecting apparatus, the probe frame including a frame body and a signal distribution circuit board provided to the frame body, wherein the probe frame further includes: a circuit board provided to the frame body, the circuit board being provided with through holes, and the circuit board being provided therein with a plurality of signal transmission wires in a one to one correspondence with the through holes, one end of each signal transmission wire is inserted into its respective through hole and the other end thereof is electrically connected with an output end of the signal distribution circuit board; and a plurality of probes in a one to one correspondence with the through holes, wherein for each pair of the probe and the through hole, one end of the probe is inserted into the through hole so as to be electrically connected with the signal transmission wire within the through hole. Electrical connection between respective probes and the signal distribution circuit board are achieved through signal transmission wires in the circuit board, wir- (Continued)

ing on the probe frame is simple, and stability in signal connections between probes and the signal distribution circuit board can be improved. The present invention further provides an array substrate detecting apparatus including the above probe frame.

11 Claims, 4 Drawing Sheets

(51) Int. Cl.
*G01R 31/28* (2006.01)
*G09G 3/36* (2006.01)

(56) References Cited

OTHER PUBLICATIONS

First Chinese Office Action for Chinese Patent Application No. 201210546649.4, dated Dec. 3, 2014, 9 pages.

\* cited by examiner

PROBE FRAME FOR ARRAY SUBSTRATE DETECTING APPARATUS AND DETECTING APPARATUS HAVING THE SAME

CROSS-REFERENCE TO RELATED APPLICATION

This application claims the benefit of Chinese Patent Application No. 201210546649.4 filed on Dec. 14, 2012 in the State Intellectual Property Office of China, the whole disclosure of which is incorporated herein by reference.

BACKGROUND OF THE INVENTION

Field of the Invention

The present invention relate to a technical field of testing electrical characteristics of an array substrate, and more particularly, to a probe frame for an array substrate detecting apparatus and a detecting apparatus.

Description of the Related Art

A process of manufacturing a TFT-LCD generally includes following three stages:

1. array forming process, in which several independent TFT pixel array circuit regions are formed in a larger glass substrate, each pixel array circuit region corresponding to a liquid crystal display screen panel;

2. cell forming process, in which the TFT array substrate is coated with liquid crystal and covered with a color filter so that a LCD panel is assembled, and the LCD panel is cut into independent liquid crystal display screens;

3. providing a backlight source, polarization sheets, periphery circuits, etc. for the liquid crystal display screen so as to form a complete TFT-LCD display module.

As shown in FIG. 1, in the array forming process, a plurality of TFT pixel array circuit regions 02 are deposited on a glass substrate 01, each TFT pixel array circuit region corresponds to a piece of array substrate. In order to achieve detection of electrical characteristics of each piece of array substrate, the glass substrate 01 is further provided with a plurality of detection pads 03 each corresponding to each array substrate, and these detection pads 03 are connected to respective display screen signal lead wires by wires. Measurement of electrical parameters of the array substrate is performed by an array substrate detecting apparatus.

As shown in FIG. 2, the above detecting apparatus includes a probe frame, which includes a frame body 04, a plurality of probes 05 arranged on the frame body 04 and corresponding to the above detection pads 03 in a one to one relationship, a signal distribution circuit board 06 provided on the frame body 04, and wires 051 corresponding to the probes 05 in a one to one relationship and connecting the probes 05 to its respective signal distribution circuit board 06. Test signals generated by the detecting apparatus are distributed by the signal distribution circuit board 06, and are transmitted to respective probes 05 through the wires 051, and during testing, an electrical detection is made by contacting the probes 05 on the frame body 04 with the detection pads 03 on the array substrate and by inputting test signals.

Mounting of the probes 05 on the frame body 04 is schematically shown in FIG. 3, where the probes 05 are mounted within through holes 041 in the frame body 04, and tops of the probes 05 are soldered with the wires 051.

However, since many independent TFT pixel array circuit regions 02 are formed on the glass substrate at a time, each TFT pixel array circuit region 02 corresponding to one array substrate, and each array substrate is provided with a plurality of detection pads 03, the number of the probes 05 on the frame body 04 of the detecting apparatus is great, so that the number of the wires 051 is great, resulting in a complex wiring, which is difficult to be performed due to a limited space; further, the wires may be easily contacted by the probe frame during movement of the probe frame, so that the wires 051 may be worn, resulting in a poor stability in connection between the wires 051 and the probes 05, thus, the wires 051 will be easily disconnected from solder joints during operation, which may form open circuit between the wires 051 and the probes 05 and even short circuit between the wires 051, thereby imposing a negative effect on detection.

SUMMARY OF THE INVENTION

The present invention provides a probe frame for an array substrate detecting apparatus and an array substrate detecting apparatus, wherein wiring on the probe frame is simple, and stability in a signal connection between probes and a signal distribution circuit board can be improved.

In order to achieve the above object, the present invention provides following technical solutions:

a probe frame for an array substrate detecting apparatus, including a frame body and a signal distribution circuit board provided on the frame body, the probe frame further includes:

a transmission wire circuit board provided on the frame body, the transmission wire circuit board being provided with a plurality of through holes in a one to one correspondence with detection pads on an array substrate, and the transmission wire circuit board being provided with a plurality of signal transmission wires therewithin in a one to one correspondence with the through holes; and a plurality of probes in a one to one correspondence with the through holes, wherein for each pair of the probe and the through hole, one end of the probe is inserted into the through hole so as to be electrically connected with one end of the signal transmission wire, the other end of the signal transmission wire is electrically connected with an output end of the signal distribution circuit board, and the other end of the probe is adapted to be electrically connected with a respective detection pad.

Alternatively, the signal transmission wire of are electrically connected with the output end of the signal distribution circuit board by a ribbon cable.

Alternatively, the transmission wire circuit board is fixedly connected with the frame body, the frame body is provide with circular holes in a one to one correspondence with the probes, and the probes are configured to be inserted into respective through holes through respective circular holes.

Alternatively, the transmission wire circuit board is connected with the frame body to be slidable relative to each other in a length direction of the transmission wire circuit board, the frame body is provided with through slots corresponding to the probes, and the through slots extend in the length direction.

Alternatively, the probe frame further includes a first drive device, which is fixed on the frame body and drives a displacement of the transmission wire circuit board in the length direction.

Further, the probe frame further includes a second drive device, which is fixed on the frame body and drives a displacement of the transmission wire circuit board in width direction perpendicular to the length direction.

Alternatively, the first drive device includes a first electric motor provided on the frame body, and the second drive device includes a second electric motor provided on the frame body.

Alternatively, the probe frame further includes a limit sensor, which is provided on the frame body and detects a amount of displacement of the transmission wire circuit board.

Alternatively, each through hole is elastically snapped and engaged with one end of a respective probe so as to form an electrical connection.

Further, the one end of each signal transmission wire is formed as an elastic clamp, the one end of the probe inserted into the through hole mates with the elastic clamp.

The present invention also relates to a probe frame for an array substrate detecting apparatus, including:

a frame body;

a signal distribution circuit board provided on the frame body; and a plurality of signal transmission wires, one end of each of which is adapted to be electrically connected with one corresponding detection pad, and the other end of each of which is adapted to be electrically connected with an output end of the signal distribution circuit board, wherein the probe frame further includes a transmission wire board provided on the frame body, the plurality of signal transmission wires are gathered on and/or within the transmission wire board.

Alternatively, the transmission wire board is a transmission wire circuit board.

The present invention further provides an array substrate detecting apparatus including the probe frame as defined in any one the above technical solutions.

The probe frame for an array substrate detecting apparatus provided according to the present invention includes a frame body and a signal distribution circuit board provided on the frame body, the probe frame further includes:

a transmission wire circuit board provided on the frame body, the transmission wire circuit board being provided with a plurality of through holes in a one to one correspondence with detection pads on an array substrate, and the transmission wire circuit board being provided with a plurality of signal transmission wires therewithin in a one to one correspondence with the through holes; and a plurality of probes in a one to one correspondence with the through holes, wherein for each pair of the probe and the through hole, one end of the probe is inserted into the through hole so as to be electrically connected with one end of the signal transmission wire.

In the probe frame provided according to the present invention, electrical connections between respective probes and the signal distribution circuit board are achieved through signal transmission wires in the circuit board, which have a compact arrangement, are fixed in position relative to each other and can be arranged in a multilayer configuration, thereby the probe frame will not directly contact with respective signal transmission wires during its movement.

Thus, in the probe frame according to the present invention, wiring on the probe frame is simple, and stability in signal connection between the probes and the signal distribution circuit board can be improved.

In addition, the present invention further provides an array substrate detecting apparatus including the above probe frame, wherein the detecting apparatus has a higher stability.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
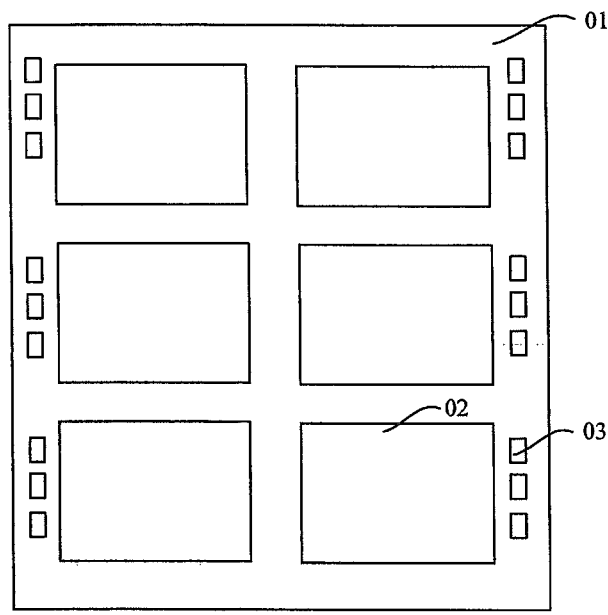
FIG. 1 is a structural diagram showing a plurality of TFT pixel array circuit regions and detection pads formed on a glass substrate during an array forming process.
Figure 2:
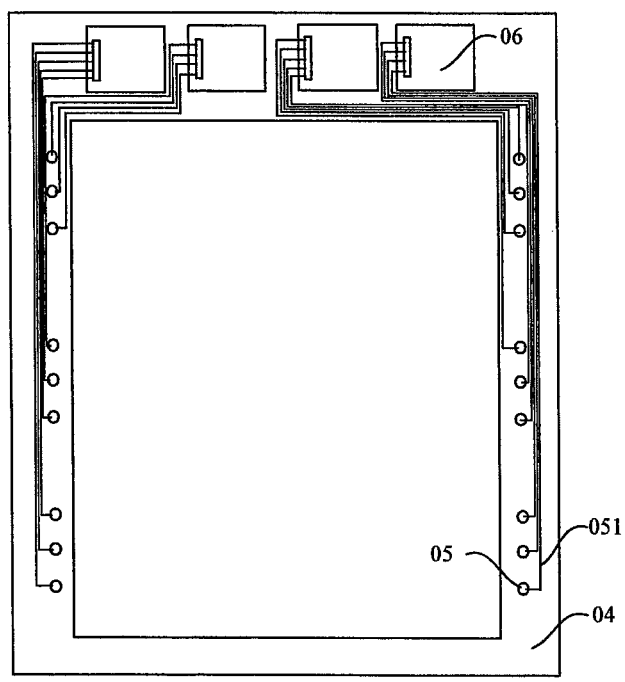
FIG. 2 is a structural diagram showing a probe frame of an array substrate detecting apparatus in prior art.
Figure 3:
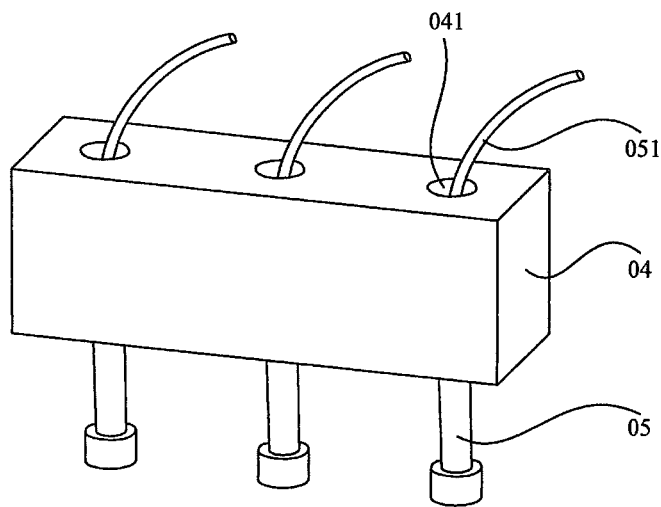
FIG. 3 is a diagram showing mounting of probes on the probe frame shown in FIG. 2.

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the disclosure to those skilled in the art.

Figure 4:
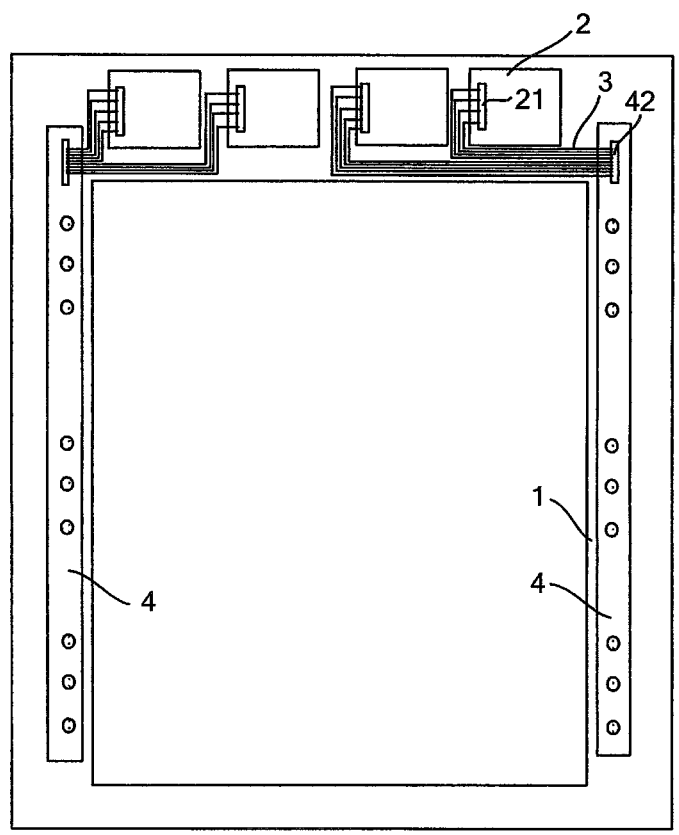
FIG. 4 is a structural diagram showing a probe frame according to an exemplary embodiment of the present invention.

As shown in FIG. 4, a probe frame for an array substrate detecting apparatus according to an exemplary embodiment of the present invention includes a frame body 1 and a signal distribution circuit board 2 provided on the frame body 1, the probe frame further includes:

a transmission wire circuit board 4 (referred to as hereafter circuit board 4) provided on the frame body 1, the circuit board 4 being provided with a plurality of through holes in a one to one correspondence with detection pads 03 on an array substrate, and the circuit board 4 being provided therein with a plurality of signal transmission wires in a one to one correspondence with the through holes, one end of each signal transmission wire is inserted into its respective through hole and the other end thereof is electrically connected with an output end of the signal distribution circuit board 2; and a plurality of probes 5 in a one to one correspondence with the through holes, wherein for each pair of the probe 5 and the through hole, one end of the probe 5 is inserted into the through hole so as to be electrically connected with the signal transmission wire within the through hole.

Detection signals from a detecting apparatus are transmitted to signal transmission wires within the circuit board 4 through the signal distribution circuit board respectively, and to the probes 5 within each of the through holes through the signal transmission wires, the probe 5 electrically contact with detection pads on the glass substrate 01 so as to input the test signals into the detection pads, thereby electrical parameters of the TFT pixel array circuit regions 02 on the glass substrate can be measured.

The respective signal transmission wires have been designed during design of the circuit board 4, and can be arranged in a multilayer configuration if the number of the signal transmission wires is great so as to ensure insulation among signal transmission wires; the signal transmission wires within the circuit board 4 have a compact arrangement, the stability in signal transmission is good, the probe frame will not directly contract with respective signal transmission wires during movement of the probe frame, thereby the signal transmission wires will not be worn, and a negative effect on detection due to damage and open circuit of the signal transmission wires and short circuits among the signal transmission wires can be reduced.

Therefore, in the probe frame provided according to the present invention, wiring on the probe frame is simple, and stability in signal connection between the probes and the signal distribution circuit board can be improved.

Electrical connection between the signal transmission wires of the circuit board 4 and the signal distribution circuit board 2 mentioned in the above embodiments can be achieved by a number of ways, for example, by wires, alternatively, by a ribbon cable, that is, a flexible circuit board; as shown in FIG. 4, the signal transmission wires of the above circuit board 4 are electrically connected with an output end of the signal distribution circuit board 2 by a ribbon cable 3. Specifically, one end of the ribbon cable 3 is electrically connected with an input terminal 42 of the circuit board 4, and the other end of the ribbon cable 3 is electrically connected with an output terminal 21 of the signal distribution circuit board 2. The ribbon cable 3 has a small volume, a light weight, etc., and thus can be used instead of a wiring harness wire of large volume, thereby achieving a miniaturization.

Alternatively, as shown in FIG. 4, the above circuit board 4 can be fixedly connected with the frame body 1, the frame body 1 is provide with circular holes in a one to one correspondence with the probes. An electrical connection between the input terminal 42 of the circuit board 4 and the output terminal 21 of the signal distribution circuit board 2 can be achieved by the ribbon cable 3, which is a copper circuit etched on a polymer base or a printed polymer thick film circuit, can achieve a multilayer three dimension assembly for devices which are thin, light, and compact and complex in structure, and has a volume reduction by 70% compared to using a conventional circular wire harness; in addition, the strength of the ribbon cable 3 can be increased by using reinforcement materials or a lining board so as to obtain an additional mechanical stability. Thus, using the ribbon cable 3 can improve stability in the electrical connection between the circuit board 4 and the signal distribution circuit board 2.

Figure 6:
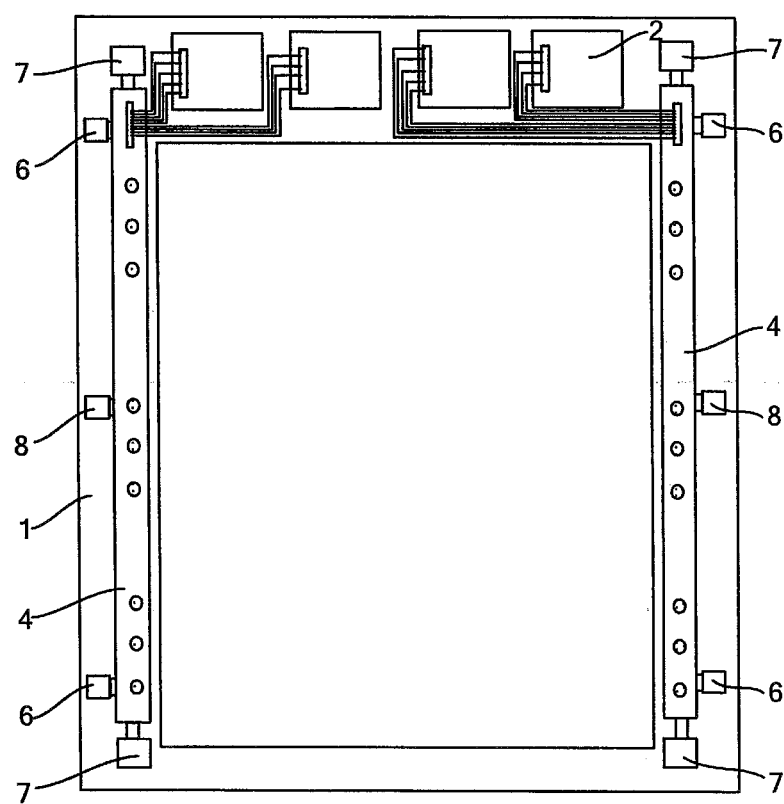
FIG. 6 is another structural diagram showing a probe frame according to an exemplary embodiment of the present invention the present invention.
Figure 7:
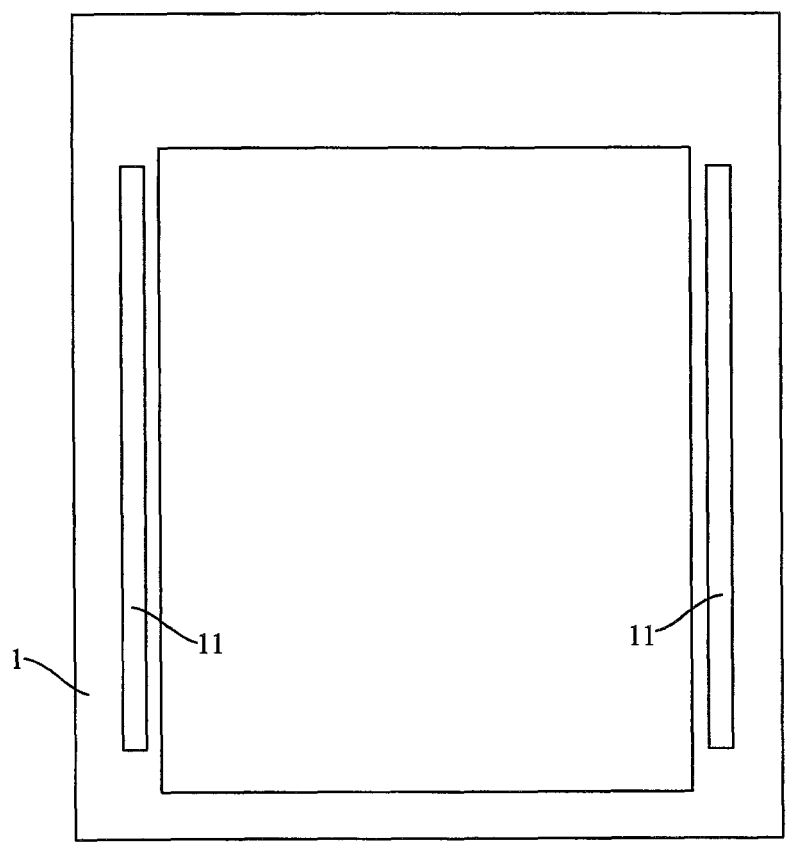
FIG. 7 is a structural diagram showing a frame body of the probe frame shown in FIG. 6.

As shown in FIGS. 6 and 7, alternatively, the above circuit board 4 can be slidably connected with the frame body 1, and the frame body 1 is provided with through slots 11 corresponding to the probes 5. There are various types of electric products, and a position of a detection pad 03 corresponding to a TFT pixel array circuit region 02 will be varied when the type of the electric product is varied; if the circuit board 4 is slidably connected with the frame 1, positions of the probes 5 on the circuit boards can be adjusted by relative positions between the circuit board 4 and the frame body 1, so that the probes 5 match with corresponding detection pads 03 to complete detection; meanwhile, the frame body 1 is provided with through slots 11 through which the probes 5 pass, such that the probes 5 can be freely moved as the circuit board 4 is moved.

Alternatively, the circuit board 4 is electrically connected with signal distribution circuit board 2 by the ribbon cable 3, the ribbon cable 3 can be moved, bent, twisted without damaging wires, thereby complying with different shapes and particular package sizes.

Of course, in order to achieve displacement of the circuit board 4, the above probe frame may further include a first drive device, which is fixed to the frame body 1 and drives the circuit board 4 to move in a length direction of the circuit board 4. The above probe frame further includes a second drive device, which is fixed to the frame body 1 and drives the circuit board 4 to move in a width direction of the circuit board 4.

As shown in FIG. 6, specifically, the above first drive device includes a first electric motor 7 provided to the frame body 1, and the second drive device includes a second electric motor 6 provided to the frame body 1.

Of course, in order to limit a distance by which the circuit board 4 is moved and a position of the circuit board 4 after being moved, the above probe frame further includes a limit sensor, which is provided to the frame body 1 and detects a amount of displacement of the circuit board 4.

Figure 5:
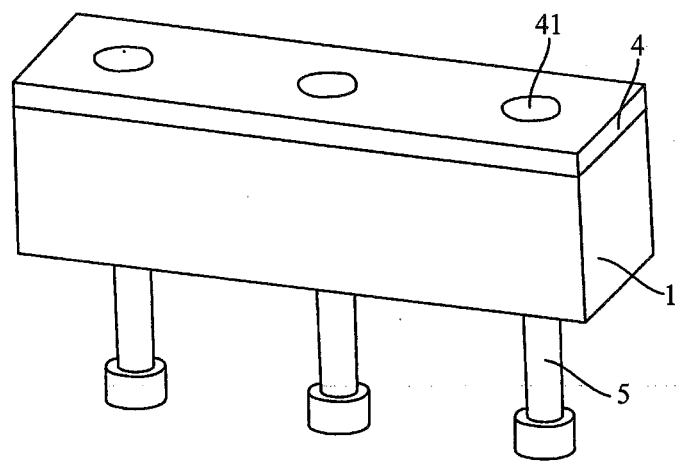
FIG. 5 is a diagram showing mounting of probes on the probe frame according to an exemplary embodiment of the present invention.

In the above embodiments, each through hole 41 is elastically snapped and engaged with one end of a respective probe 5 so as to form an electrical connection. There are various ways for mounting the probes 5 to the circuit board 4, alternatively, as shown in FIG. 5, in the above circuit board 4, the one end of each signal transmission wire inserted into the through hole 41 is formed as an elastic clamp (not shown in the figure), the one end of the probe 5 inserted into the through hole mates with the elastic clamp and is electrically connected with the signal transmission wire by the elastic clamp. As such, when a certain probe 5 is damaged, the damaged probe 5 can be token out of the respective through hole 41 directly, and then a new probe 5 is inserted into the through hole 41, thereby facilitating replacement of the probe 5. The elastic clamp can also be directly formed in the through hole 41, which is electrically connected with the signal transmission wire, or alternatively, the elastic clamp may be a part of the one end of the signal transmission wire inserted into the through hole 41.

The present invention also relates to a probe frame for an array substrate detecting apparatus, including:

a frame body 1;

a signal distribution circuit board 2 provided on the frame body 1;

a plurality of signal transmission wires, one end of each of which is adapted to be electrically connected with one corresponding detection pad, and the other end of each of which is adapted to be electrically connected with an output end of the signal distribution circuit board; and a transmission wire board provided on the frame body 1, the plurality of signal transmission wires are gathered on and/or within the transmission wire board.

The term "gather" herein means that the plurality of signal transmission wires can be integrated on the transmission wire board, or that the signal transmission wires extend through a passage in the board (the passage functions to collect the wires). The transmission wire board may be the above mentioned circuit board 4. The transmission wire board may be also a box-shaped member with a passage through which the signal transmission wires extend. With the plurality of the probes described above, the probes electrically connected with the signal transmission wires can be also provided outside of the box-shaped member.

Also, the present invention further provides an array substrate detecting apparatus, including the probe frame provided in any one of the above embodiments. Since wiring between the probes of the above probe frame and the signal distribution circuit board is simple, and stability in signal connection between the probes and the signal distribution circuit board can be improved, thus, the stability of the array substrate detecting apparatus is higher.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A probe frame for an array substrate detecting apparatus, the probe frame including a frame body and a signal distribution circuit board provided on the frame body, and the probe frame further including:
   a transmission wire circuit board provided on the frame body, the transmission wire circuit board being provided with a plurality of through holes in a one to one correspondence with detection pads on an array substrate, and the transmission wire circuit board being provided therein with a plurality of signal transmission wires in a one to one correspondence with the through holes; and
   a plurality of probes in a one to one correspondence with the through holes,
   wherein for each pair of the probe and the through hole, one end of the probe is inserted into the through hole so as to be electrically connected with one end of the signal transmission wire, the other end of the signal transmission wire is electrically connected with an output end of the signal distribution circuit board, and the other end of the probe is adapted to be electrically connected with a respective detection pad,
   the transmission wire circuit board is connected with the frame body to be slidable relative to each other in a length direction of the transmission wire circuit board,
   the frame body is provided with through slots corresponding to the probes, and the through slots extend in the length direction.

2. The probe frame according to claim 1, wherein the signal transmission wires of the transmission wire circuit board are electrically connected with the output end of the signal distribution circuit board by a ribbon cable.

3. The probe frame according to claim 1, further including:
   a first drive device, which is fixed to the frame body and drives the transmission wire circuit board to move in the length direction.

4. The probe frame according to claim 3, further including:
   a second drive device, which is fixed to the frame body and drives the transmission wire circuit board to move in a width direction perpendicular to the length direction.

5. The probe frame according to claim 4, wherein the first drive device includes a first electric motor provided to the frame body, and the second drive device includes a second electric motor provided to the frame body.

6. The probe frame according to claim 5, further including:
   a limit sensor, which is provided to the frame body and detects a amount of displacement of the transmission wire circuit board.

7. The probe frame according to claim 1, wherein each through hole is elastically snapped and engaged with one end of a respective probe so as to form an electrical connection.

8. The probe frame according to claim 7, wherein the one end of each signal transmission wire is formed as an elastic clamp, and the one end of the probe inserted into the through hole mates with the elastic clamp.

9. The probe frame according to claim 2, wherein each through hole is elastically snapped and engaged with one end of a respective probe so as to form an electrical connection.

10. The probe frame according to claim 1, wherein each through hole is elastically snapped and engaged with one end of a respective probe so as to form an electrical connection.

11. An array substrate detecting apparatus including the probe frame as defined in claim 1.

* * * * *